(12) United States Patent
Fehler et al.

(10) Patent No.: US 11,469,164 B2
(45) Date of Patent: Oct. 11, 2022

(54) SPACE EFFICIENT AND LOW PARASITIC HALF BRIDGE

(71) Applicant: Infineon Technologies AG, Neubiberg (DE)

(72) Inventors: Robert Fehler, Regensburg (DE); Eung San Cho, Torrance, CA (US); Danny Clavette, Greene, RI (US); Petteri Palm, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 275 days.

(21) Appl. No.: 16/744,967

(22) Filed: Jan. 16, 2020

(65) Prior Publication Data
US 2021/0225745 A1 Jul. 22, 2021

(51) Int. Cl.
| | | |
|---|---|---|
| *H01L 23/48* | (2006.01) | |
| *H01L 23/12* | (2006.01) | |
| *H01L 23/34* | (2006.01) | |
| *H01L 21/00* | (2006.01) | |
| *H05K 7/00* | (2006.01) | |
| *H05K 1/18* | (2006.01) | |
| *H05K 7/10* | (2006.01) | |
| *H05K 7/18* | (2006.01) | |
| *H01L 23/495* | (2006.01) | |

(Continued)

(52) U.S. Cl.
CPC .. *H01L 23/49575* (2013.01); *H01L 23/49513* (2013.01); *H01L 23/49537* (2013.01); *H01L 23/49562* (2013.01); *H01L 24/06* (2013.01); *H01L 24/37* (2013.01); *H01L 24/40* (2013.01); *H01L 24/84* (2013.01); *H01L 25/072* (2013.01); *H01L 2224/0603* (2013.01); *H01L 2924/13091* (2013.01)

(58) Field of Classification Search
CPC ............... H01L 25/072; H01L 23/3107; H01L 23/49562; H01L 24/06; H01L 23/49575; H01L 23/49513; H01L 23/49537; H01L 24/40; H01L 24/37; H01L 24/84; H01L 23/59575
See application file for complete search history.

(56) References Cited

U.S. PATENT DOCUMENTS

| | | | |
|---|---|---|---|
| 2013/0010446 A1* | 1/2013 | Henrik | H01L 24/27 361/783 |
| 2015/0214189 A1 | 7/2015 | Tan et al. | |

(Continued)

*Primary Examiner* — Alonzo Chambliss
(74) *Attorney, Agent, or Firm* — Murphy, Bilak & Homiller, PLLC

(57) ABSTRACT

A packaged half-bridge circuit includes a carrier having a dielectric core and a first layer of metallization formed on an upper surface of the carrier, first and second semiconductor chips, each including a first terminal, a second terminal, and a control terminal, and a conductive connector mounted on the upper surface of the carrier and electrically connected to the first layer of metallization. The first semiconductor chip is configured as a high-side switch of the half-bridge circuit. The second semiconductor chip is configured as a low-side switch of the half-bridge circuit. At least one of the first and second semiconductor chips is embedded within the dielectric core of the carrier. The conductive connector is electrically connected to one of the first and second terminals from one or both of the first and second semiconductor chips.

18 Claims, 10 Drawing Sheets

(51) Int. Cl.
*H01L 25/07* (2006.01)
*H01L 23/00* (2006.01)

(56) References Cited

U.S. PATENT DOCUMENTS

2016/0099238 A1 4/2016 Niu et al.
2018/0033762 A1 2/2018 Gowda et al.

* cited by examiner

SPACE EFFICIENT AND LOW PARASITIC HALF BRIDGE

TECHNICAL FIELD

The instant application relates to semiconductor devices and in particular relates to packaged voltage converters.

BACKGROUND

Power applications, i.e., applications utilizing voltages in excess of 250V, 500V, 1000V, etc. or greater and/or current in excess of 1 A, 5 A, 10 A, etc. or greater commonly employ circuits with semiconductor transistors. One example is a so-called half-bridge circuit, which is used in power converters, e.g., AC to DC, DC to DC, etc. A half-bridge circuit includes two series connected switching devices. These switching devices can be implemented with semiconductor transistors such as MOSFETs (Metal Oxide Semiconductor Field Effect Transistors), HEMTs (high-electron-mobility Field Effect Transistors), IGBTs (insulated gate bipolar transistors), etc.

Half-bridge circuits for power converters can be implemented in a single device package. In such a device package, an important design goal is to reduce the reduce the parasitic impact, i.e., resistance, inductance, capacitance, etc., of the electrical connections of the circuit. As half-bridge circuits operate at high frequencies and conduct large currents, minimizing the parasitic impact of the electrical connections between the switching devices and the input/output terminals of the device favorably reduces power consumption. However, known package configurations of half-bridge circuits have poor space efficiency and high parasitic impacts.

SUMMARY

A packaged half-bridge circuit is disclosed. According to an embodiment, the packaged half-bridge circuit comprises a carrier comprising a dielectric core and a first layer of metallization formed on an upper surface of the carrier, first and second semiconductor chips, each comprising a first terminal, a second terminal, and a control terminal, and a conductive connector mounted on the upper surface of the carrier and electrically connected to the first layer of metallization. The first semiconductor chip is configured as a high-side switch of the half-bridge circuit. The second semiconductor chip is configured as a low-side switch of the half-bridge circuit. At least one of the first and second semiconductor chips is embedded within the dielectric core of the carrier. The conductive connector is electrically connected to one of the first and second terminals from one or both of the first and second semiconductor chips.

Separately or in combination, the half bridge circuit further comprises a driver chip that is electrically connected to the control terminals of the first and second semiconductor chips, and the driver chip is disposed on or within the carrier.

Separately or in combination, the driver chip is mounted on the upper surface of the carrier Separately or in combination, the driver chip is embedded within the dielectric core of the carrier.

Separately or in combination, the packaged half-bridge circuit further comprises a passive electrical component that is electrically connected to one or both of the high-side and the low-side switches, wherein the passive electrical component is disposed on or within the carrier.

Separately or in combination, the second semiconductor chip is embedded within the dielectric core of the carrier, the first terminal of the second semiconductor chip is disposed on a rear surface of the second semiconductor chip which faces the upper surface of the carrier, and the first terminal of the second semiconductor chip is electrically connected to a first bond pad that is formed in the first layer of metallization.

Separately or in combination, the first semiconductor chip is mounted on the upper surface of the carrier directly over the second semiconductor chip and directly over the first bond pad, the second terminal of the first semiconductor chip is disposed on a main surface of the first semiconductor chip which faces the upper surface of the carrier, and the second terminal of the first semiconductor chip is electrically connected to the first bond pad.

Separately or in combination, the first terminal of the first semiconductor chip is disposed on a rear surface of the first semiconductor chip which faces away from the upper surface of the carrier, the conductive connector is electrically connected to the first terminal of the first semiconductor chip and to a second bond pad that is formed in the first layer of metallization, and the second bond pad is electrically connected to a voltage source terminal of the packaged half-bridge circuit.

Separately or in combination, the conductive connector is a metal clip that is affixed to the first semiconductor chip and to the second bond pad by a conductive adhesive material.

Separately or in combination, the carrier further comprises sixth and seventh bond pads that are each formed in the first layer of metallization, the metal clip comprises a first wing that extends across a first edge side of the first semiconductor chip and reaches the second bond pad, a second wing that extends across a second edge side of the first semiconductor chip and reaches the sixth bond pad, and a third wing that extends across a third edge side of the first semiconductor chip and reaches the seventh bond pad.

Separately or in combination, the packaged half-bridge circuit further comprises an electrically insulating encapsulant body that is formed on the upper surface of the carrier, the encapsulant body encapsulates the first semiconductor chip, and an upper surface of the metal clip is exposed from an upper surface of the encapsulant body.

Separately or in combination, the first semiconductor chip and the conductive connector are integral components of a discrete semiconductor device that is mounted on the upper surface of the carrier, the conductive connector is a lead frame of the discrete semiconductor device, the discrete semiconductor device is arranged with the first semiconductor chip disposed between the lead frame and the carrier, and the lead frame extends to and electrically contacts the second bond pad.

Separately or in combination, the packaged half-bridge circuit further comprises an electrically insulating encapsulant body that is formed on the upper surface of the carrier, the encapsulant body encapsulates the packaged semiconductor device, and an upper surface of the lead frame is exposed from an upper surface of the encapsulant body.

Separately or in combination, the first semiconductor chip is embedded within the dielectric core of the carrier, the second terminal of the first semiconductor chip is disposed on a main surface of the first semiconductor chip which faces the upper surface of the carrier, and the conductive connector forms at least part of an electrical connection between the second terminal of the first semiconductor chip and an output terminal of the packaged half-bridge circuit.

Separately or in combination, the conductive connector is arranged such that current must flow through the conductive connector when flowing between the second terminal of the first semiconductor chip device and the output terminal of the packaged half-bridge circuit.

A method of producing a packaged half-bridge circuit is disclosed. According to an embodiment, the method comprises providing a carrier comprising a dielectric core and a first layer of metallization formed on an upper surface of the carrier, providing first and second semiconductor chips, each comprising a first terminal, a second terminal, and a control terminal, and mounting a conductive connector on the upper surface of the carrier and electrically connecting the connective connector to the first layer of metallization. The first semiconductor chip is configured as a high-side switch of the packaged half-bridge circuit. The second semiconductor chip is configured as a low-side switch of the packaged half-bridge circuit. At least one of the first and second semiconductor chips is embedded within the dielectric core of the carrier. The conductive connector is electrically connected to one of the first and second terminals from one or both of the first and second discrete semiconductor switching devices.

Separately or in combination, the method further comprises embedding the second semiconductor chip within the dielectric core of the carrier such that a rear surface of the second semiconductor chip that comprises the first terminal of the second semiconductor chip faces the upper surface of the carrier, mounting the first semiconductor chip on the upper surface of the carrier such that a rear surface of the second semiconductor chip that comprises the first terminal of the first semiconductor chip faces away from the upper surface of the carrier, and electrically connecting the first terminal of the first semiconductor chip to a second bond pad that is formed in the first layer of metallization with the conductive connector.

Separately or in combination, electrically connecting the first terminal of the first semiconductor chip to the second bond pad comprises attaching a metal clip to the first terminal of the first semiconductor chip and to the second bond pad.

Separately or in combination, the method further comprises providing a discrete semiconductor device comprising the first semiconductor chip mounted on an electrically conductive lead frame, and mounting the discrete semiconductor device on the upper surface of the carrier with the first semiconductor chip disposed between the lead frame and the carrier and with the lead frame extending to and electrically contacting the second bond pad.

Separately or in combination, the method further comprises embedding the second semiconductor chip within the dielectric core of the carrier such that a rear surface of the second semiconductor chip that comprises the first terminal of the second semiconductor chip faces the upper surface of the carrier, embedding the first semiconductor chip within the dielectric core of the carrier such that a main surface of the first semiconductor chip that comprises the second terminal of the first semiconductor chip faces the upper surface of the carrier, and mounting a metal clip on the upper surface of the carrier such that the metal clip forms at least part of an electrical connection between the second terminal of the first semiconductor chip and an output terminal of the packaged half-bridge circuit, wherein the metal clip is the conductive connector.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments of a packaged half-bridge circuit with advantageous space-efficiency and low parasitic electrical connections are described herein. The packaged half-bridge circuit may include a carrier structure with a PCB (printed circuit board) configuration, i.e., a board having an insulating core and patterned conductive tracks formed on or within the insulating core. The switches of the half-bridge circuit may be implemented by discrete semiconductor chips that are accommodated by the carrier. At least one of these discrete semiconductor chips may be embedded within the dielectric core of the carrier. This allows for short connection paths to an output terminal of the half-bridge circuit. Another one of the output connections of the half-bridge circuit may be provided by a low-resistance electrical connector that is mounted on an upper surface of the carrier. The electrical connector extends across a short span to reach its connection point. Hence, both output connections have low resistance and/or inductance. Meanwhile, by embedding at least one of the semiconductor chips within the carrier, a smaller device area may be realized. Moreover, the PCB configured carrier allows for the integration of other components of the half-bridge circuit, such as a driver chip and passive components, in one device package.

Figure 1:
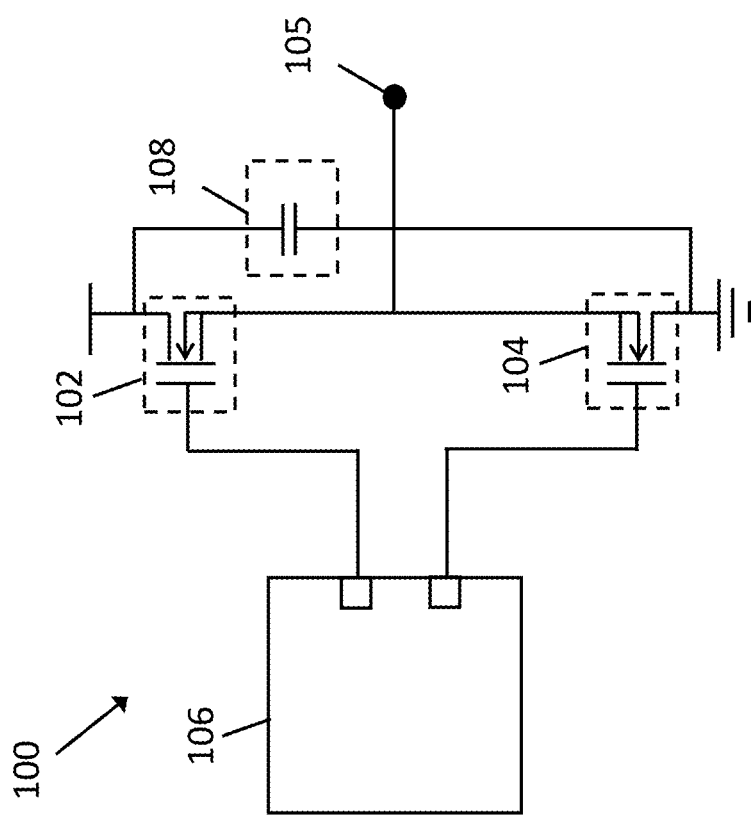
FIG. 1 illustrates an electrical schematic of a half-bridge circuit, according to an embodiment.

Referring to FIG. 1, a half-bridge circuit 100 is schematically depicted, according to an embodiment. The half-bridge circuit 100 includes a high-side switch 102 and a low-side switch 104. The high-side switch 102 and the low-side switch 104 are series connected between a fixed voltage source (e.g., a voltage of 200V, 500V, 1000V, etc.) and a reference potential (e.g., GND). The high-side switch 102 and low-side switch 104 may be implemented by transistor devices. For example, in the depicted embodiment, the high-side switch 102 and the low-side switch are each implemented by enhancement mode MOSFET devices. The MOSFET devices are connected in series such that the source terminal of the high-side switch 102 is connected to the drain terminal of the low-side switch 104. The source terminal of the high-side switch 102 and the drain terminal of the low-side switch 104 connect to an output terminal 105 of the half-bridge circuit 100. More generally, the high-side switch 102 and low-side switch 104 can be implemented using a variety of different switching devices, e.g., MOSFETs (both enhancement and depletion), IGBTs, HEMTs, etc.

The half-bridge circuit 100 can be configured as a power converter, e.g., AC to AC, AC to DC, DC to DC. Power conversion is achieved by cycling the high-side and low-side switches 102, 104 between ON and OFF states. To this end, a driver circuit 106 is connected to the control terminals of the high-side and low-side switches 102, 104, i.e., the gate terminals in the depicted MOSFET example. The driver circuit 106 cycles the high-side and low-side switches 102, 104 between ON and OFF states according to a timing scheme that is optimized for efficient power conversion while protecting against harmful short-circuit events. An example of such a timing scheme is a so-called pulse-width modulation (PWM) control scheme.

The half-bridge circuit 100 may include one or more passive components, e.g., capacitors, inductors, resistors, etc. Generally speaking, these passive components may be electrically connected to any node of the half-bridge circuit 100, and may be used for a number of different functions, e.g., high frequency filtering and decoupling, level shifted biasing, managing device drive strength, managing ringing frequencies, etc. In the depicted embodiment, the half-bridge circuit 100 includes a capacitor 108 connected between the voltage source and the reference potential. This capacitor 108 may have a relatively large capacitance value (e.g., 100 pF or more) which is used to provide high frequency bias filtering.

Figure 2:
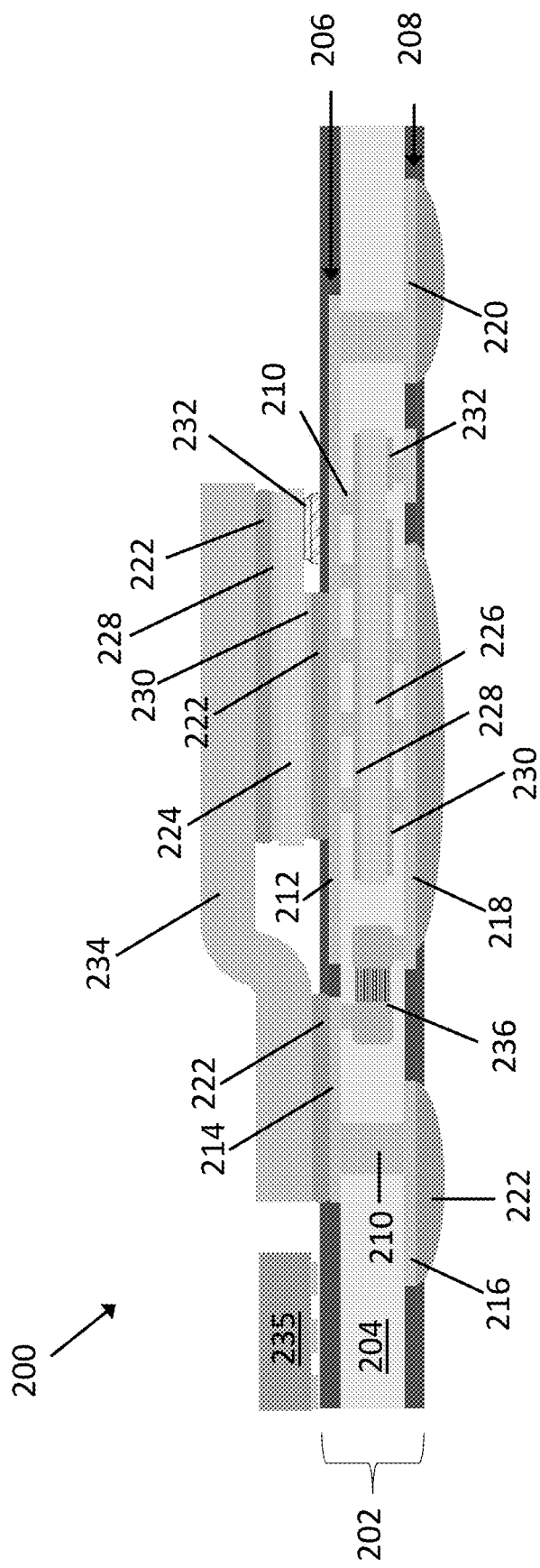
FIG. 2 illustrates a cross-sectional view of a packaged half-bridge circuit, according to an embodiment.

Referring to FIG. 2, a packaged device 200 is depicted, according to an embodiment. The packaged device 200 is a discrete package implementation of the half-bridge circuit 100 described with reference to FIG. 1. That is, the packaged device 200 is configured to be mated with an external apparatus such as a PCB, and to provide the power converting functions of the half-bridge circuit 100 described with reference to FIG. 1 at the I/O connections of this external apparatus.

The packaged device 200 includes a carrier 202. The carrier 202 includes a dielectric core 204 and one or more layers of metallization. In the depicted embodiment, the carrier 202 includes a first layer 206 of metallization formed on an upper surface of the carrier 202 and a second layer 208 of metallization formed on a lower surface of the carrier 202 that is opposite from the upper surface. In other embodiments, the carrier 202 may include one or more layers of metallization within the dielectric core 204.

The dielectric core 204 can include a wide variety of electrically insulating materials, e.g., plastic, ceramic, laminate, glass, pre-impregnated composite fiber, etc. In an embodiment, the dielectric core 204 has a thickness of between about 250 and 500 μm (microns). The metallization layers may include a wide variety of electrically conductive metals, e.g., copper, aluminum, nickel gold, etc. and alloys thereof. In an embodiment, the metallization layers 206, 208 have a thickness of between about 5 and 250 μm.

The carrier 202 may additionally include via structures 210 that vertically extend through the dielectric core 204 and form electrical connections to the devices and/or metallization layers.

In an embodiment, the carrier 202 has a similar or identical configuration as a commercially available PCB (printed circuit board). In this embodiment, the dielectric core 204 includes a PCB dielectric material, such as FR-2, FR-3, FR-4, CEM-1, CEM-2, CEM-3. Moreover, the metallization layers 206, 208 form conductive tracks which form electrical interconnects between various elements that are accommodated by the carrier 202.

The carrier 202 includes a plurality of bond pads formed in the first and second metallization layers 206, 208. Each of these bond pads are flat areas of the metallization that are configured as contact surfaces for mating with an external conductive element, e.g., bond wire, clip, ribbon, external bond pad, etc. In the depicted embodiment, the carrier 202 includes first and second bond pads 212, 214 formed in the first layer 206 of metallization, and third, fourth and fifth bond pads 216, 218 and 220 formed in the second layer 208 of metallization. The depicted carrier 202 is configured for surface mount mating with an external apparatus (e.g. a PCB), wherein the third, fourth and fifth bond pads 216, 218 and 220 form external I/O terminals which mate and electrically connect to corresponding I/O terminals in the external apparatus. The third bond pad 216 is configured as the voltage source terminal of the half-bridge circuit 100, the fourth bond pad 218 is configured as the reference potential terminal of the half-bridge circuit 100, and the fifth bond pad 220 is configured as the output terminal 105 of the half-bridge circuit 100. In each case, a conductive adhesive material 222 may be disposed on these bond pads to aid in the surface mount connections. At the upper surface of the carrier 202, the first and second bond pads 212, 214 provide connection points to the opposite side terminals. Specifically, the first bond pad 212 is electrically connected to the fifth bond pad 220 (i.e., the output terminal) by a via structure 210, and the second bond pad 214 is electrically connected to the third bond pad 216 (i.e., the voltage source terminal) by a via structure 210.

The packaged device 200 additionally includes first and second semiconductor chips 224, 226. The first semiconductor chip 224 is configured as the high-side switch 102 of the half-bridge circuit 100 and the second semiconductor chip 226 may be configured as the low-side switch 104 of the half-bridge circuit 100. Each of the first and second semiconductor chips 224, 226 include a first terminal 228, a second terminal 230, and a control terminal 232. In each case, these terminals may be implemented as electrically conductive bond pads that are disposed a main or rear surface of the respective semiconductor chip.

Generally speaking, the first and second semiconductor chips 224, 226 can be configured as any of a variety of discrete switching devices, e.g. MOSFET (Metal Oxide Semiconductor Field Effect Transistor), an IGBT (Insulated Gate Bipolar Transistor), JFET (Junction Field Effect Transistor), etc., wherein the first and second terminals 228, 230 correspond to the load terminals (e.g., source, drain, collector, emitter, etc.) and the control terminals 232 are the terminals which control a conductive connection between the load terminals (e.g., gate, base, etc.). The first and second semiconductor chips 224, 226 may include any of a wide variety of semiconductor materials, e.g., type IV semiconductors such as silicon, silicon germanium, silicon carbide, etc., and type III-V semiconductors such as gallium nitride, gallium arsenide, etc. According to an embodiment, the first and second semiconductor chips 224, 226 have a vertical device configuration. This means that the first and second terminals 228, 230 which conduct the load current of the device are disposed on opposite facing main and rear surfaces of the semiconductor chip, and these devices control a vertical current flowing between the opposite facing upper and lower surfaces. Alternatively, the first and second semiconductor chips 224, 226 may have a lateral configuration.

According to an embodiment, the first and second semiconductor chips 224, 226 are each configured as discrete MOSFET devices. Specifically, the first and second semiconductor chips 224, 226 can be configured as discrete power MOSFETs that are configured to block a substantially large voltage (e.g., a voltage in the range of 100V, 500V, 1000V or more) and/or control a substantially large current (e.g., a current in the range of 1 A, 2 A, 5 A or more) as between the respective first and second terminals 228, 230 of these chips. In these embodiments, the first terminal 228 of the first semiconductor chip 224 corresponds to a source terminal of the high-side switch 102, the second terminal 230 of the first semiconductor chip 224 corresponds to a drain terminal of the high-side switch 102, and the control terminal 232 of the first semiconductor chip 224 corresponds to a gate terminal of the high-side switch 102. Likewise, the first terminal 228 of the second semiconductor chip 226 corresponds to a source terminal of the low-side switch 104, the second terminal 230 of the second semiconductor chip 226 corresponds to a drain terminal of the low-side switch 104, and the control terminal 232 of the second semiconductor chip 226 corresponds to a gate terminal of the low-side switch 104.

At least one of the first and second semiconductor chips 224, 226 is embedded within the dielectric core 204 of the carrier 202. This means that the chip is contained within the upper and lower surfaces of the carrier 202 and is at least laterally surrounded by regions of the dielectric core 204. In the depicted embodiment, the second semiconductor chip 226 is embedded within the dielectric core 204 of the carrier 202.

One of the first and second semiconductor chips 224, 226 may be mounted on the carrier 202. This means that the semiconductor chip is disposed outside of the upper and lower surfaces of the carrier 202 and is attached to the carrier 202 e.g., by an adhesive such as solder, sinter, conductive glue, etc. in a separate process step. In the depicted embodiment, the first semiconductor chip 224 is mounted on the upper surface of the carrier 202.

The packaged device 200 additionally includes a conductive connector 234. The conductive connector 234 is mounted on the surface of the carrier 202. That is, the conductive connector 234 is disposed outside of the upper and lower surfaces of the carrier 202 and is attached to the carrier 202 e.g., by an adhesive such as solder, sinter, conductive glue, etc. in a separate process step.

The conductive connector 234 is electrically connected to one of the first and second terminals 228, 230 from one or both of the first and second semiconductor chips 224, 226. In other words, the conductive connector 234 connects to at least one terminal from one chip. For example, the conductive connector 234 can connect the high-side switch 102 to the voltage source or connect the low-side switch 104 to the reference potential or connect one or both of the high-side and low-side switches 102, 104 to the output terminal.

Generally speaking, the conductive connector 234 can include a variety of electrically conductive materials, e.g., metals such as copper, aluminum, gold, etc. and alloys thereof. Moreover, the properties of the conductive connector 234 such as thickness, geometry, etc., can be suitably adapted to meet application requirements including resistance, inductance, etc.

In the depicted embodiment, the conductive connector 234 is configured as a metal clip. This means that the conductive connector 234 is a substantially uniform thickness piece of metal with planar contact surfaces adapted for direct interfacing with the bond pads of the semiconductor chips and the carrier 202. These metal clips can be provided from a planar sheet metal that is processed according to techniques such as bending, punching, stamping, etc. In an embodiment, the conductive connector 234 is a metal clip with a thickness of between about 100 µm and 250 µm.

In the depicted embodiment, the second semiconductor chip 226 is arranged such that the first terminal 228 of the second semiconductor chip 226 is disposed on a rear surface of the second semiconductor chip 226 which faces the upper surface of the carrier 202. The first terminal 228 of the second semiconductor chip 226 is electrically connected to the first bond 212 pad by a via structure 210 which extends through the dielectric core 204. The second terminal 230 of the second semiconductor chip 226 is disposed on a rear surface of the second semiconductor chip 226 which faces the lower surface of the carrier 202. The second terminal 230 of the second semiconductor chip 226 is electrically connected to the fourth bond pad 218 by a via structure 210 which extends through the dielectric core 204.

In the depicted embodiment, the first semiconductor chip 224 is arranged such that the first terminal 228 of the first semiconductor chip 224 is disposed on a rear surface of the first semiconductor chip 224 which faces away from the upper surface of the carrier 202. The second terminal 230 of the first semiconductor chip 224 is disposed on a main surface of the first semiconductor chip 224 which faces the upper surface of the carrier 202. The second terminal 230 of the first semiconductor chip 224 is electrically connected to the first bond pad 212 by a conductive adhesive material 222, e.g., solder, sinter, conductive glue, etc.

The arrangement and electrical connection of the packaged device 200 of FIG. 2 has notable benefits. Specifically, the vertically overlapping arrangement of the first and second semiconductor chips 224, 226 means that the first bond pad 212 can be disposed directly between the drain and source terminals of the high-side and low-side switches 102, 104 respectively, of the half-bridge circuit 100. As a result, there is a very short vertical current path for load connections of the high-side and low-side switches 102, 104. Moreover, the vertical stacking of the semiconductor chips advantageously reduces the lateral area needed for the packaged half-bridge in comparison to a side-by-side configuration. Meanwhile, the conductive connector 234 advantageously provides a short conductive path between the source terminal of the high-side switch 102 and the second bond pad 214, i.e., the voltage source contact point. Due to the short connection distance, the thickness of the conductive connector 234 can advantageously be kept low (e.g., below 250 µm) so as to minimize inductance while maintaining low resistive losses. Hence, the packaged device 200 provides low-parasitic connections for multiple nodes of the half-bridge circuit 100.

The packaged device 200 may optionally include a driver chip 235. The driver chip 235 is a discrete semiconductor chip configured to provide the function of the driver circuit 106 of the half-bridge circuit 100. That is, the driver chip 235 is configured to operate the control terminals of the low-side and high-side switches 102, 104 according to a timing control scheme (e.g., PWM). In the depicted embodiment, the control terminal 232 of the first semiconductor chip 224 (i.e., the gate of the high-side switch 102) is disposed on the main surface of the first semiconductor chip 224, and the control terminal 232 of the second semiconductor chip 226 (i.e., the gate of the low-side switch 104) is disposed on the main surface of the second semiconductor chip 226. In each case, these control terminals 232 may be electrically connected to a bond pad, which in turn is electrically connected to one of the output terminals of the driver chip 235 by conductive tracks formed in the carrier 202 (not shown). Generally speaking, the driver chip 235 can be a logic chip such as a silicon-based ASIC (application specific integrated circuit).

The driver chip 235 can be disposed on or within the carrier 202. That is, the driver chip 235 is either embedded within the carrier 202, e.g., in a similar manner as the second semiconductor chip 226 or mounted on a surface of the carrier 202, e.g., in a similar manner as the first semiconductor chip 224. In the depicted embodiment, the driver chip 235 is mounted on the upper surface of the carrier 202.

The packaged device 200 may optionally include one or more passive components. The passive components can be disposed on or within the carrier 202. The passive components can be incorporated into the half-bridge circuit 100 in the manner previously described with reference to FIG. 1. For example, these passive components can be configured for DC blocking, ESD protection, impedance matching, etc., in the half-bridge circuit 100.

In the depicted embodiment, the packaged device 200 includes a discrete capacitor 236 that is embedded in the dielectric core 204. This discrete capacitor 236 corresponds to the capacitor 108 of the half bridge circuit described with reference to FIG. 1 that is connected between the voltage source terminal and the reference potential terminal. To this end, the discrete capacitor 236 is connected between the second bond pad 214 and the fourth bond pad 218 by via structures 210.

More generally, the passive components of the packaged device 200 may be implemented in a variety of different ways. For example, a discrete component (e.g., capacitor, resistor etc.) may be mounted on a bond pad formed on the upper or lower surfaces of the carrier 202. Alternatively, the passive component can be an integrally formed feature of the carrier 202. For example, the metallization of the carrier 202 can be structured in a desired geometry to provide a defined reactance, e.g., a patterned conductive track, radial stub, parallel plate capacitor, etc.

Figure 3:
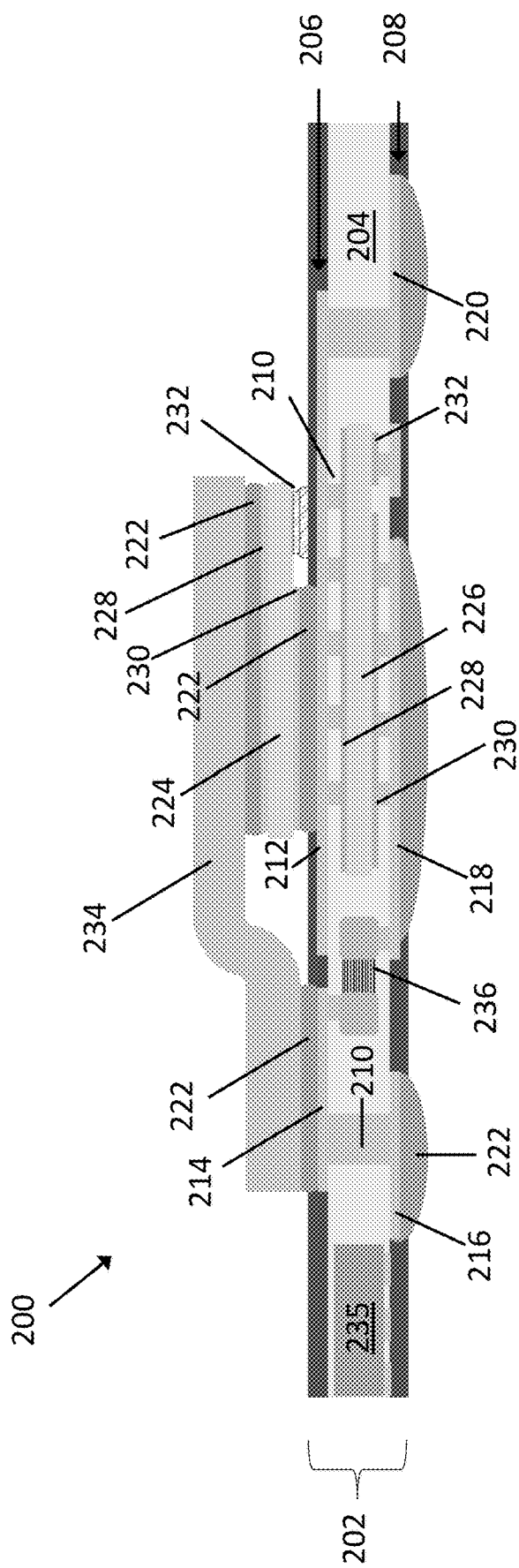
FIG. 3 illustrates a cross-sectional view of a packaged half-bridge circuit, according to an embodiment.

Referring to FIG. 3, a packaged device 200 is depicted, according to another embodiment. This packaged device 200 of FIG. 2 is identical to the packaged device 200 of FIG. 2, except that the driver chip 235 is embedded within the dielectric core 204 of the carrier 202. The electrical connections between the driver chip 235 and the control terminals 232 of the first and second semiconductor chips 224, 226 may be effectuated by conductive tracks formed in the metallization layers of the carrier 202 in a similar manner as previously described. One advantage of this configuration is that by removing the driver chip 235 from the upper surface of the carrier 202, the size of the bond pads and/or the conductive connector 235 may be increased.

Figure 4:
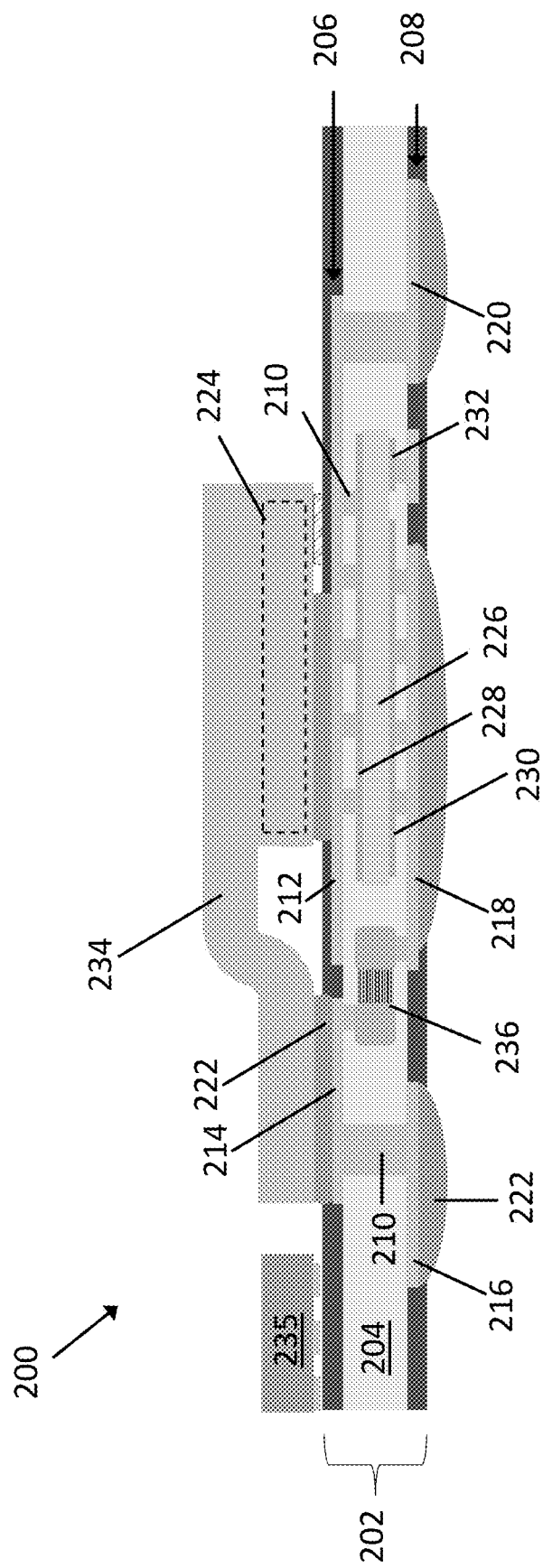
FIG. 4 illustrates a cross-sectional view of a packaged half-bridge circuit, according to an embodiment.
Figure 5:
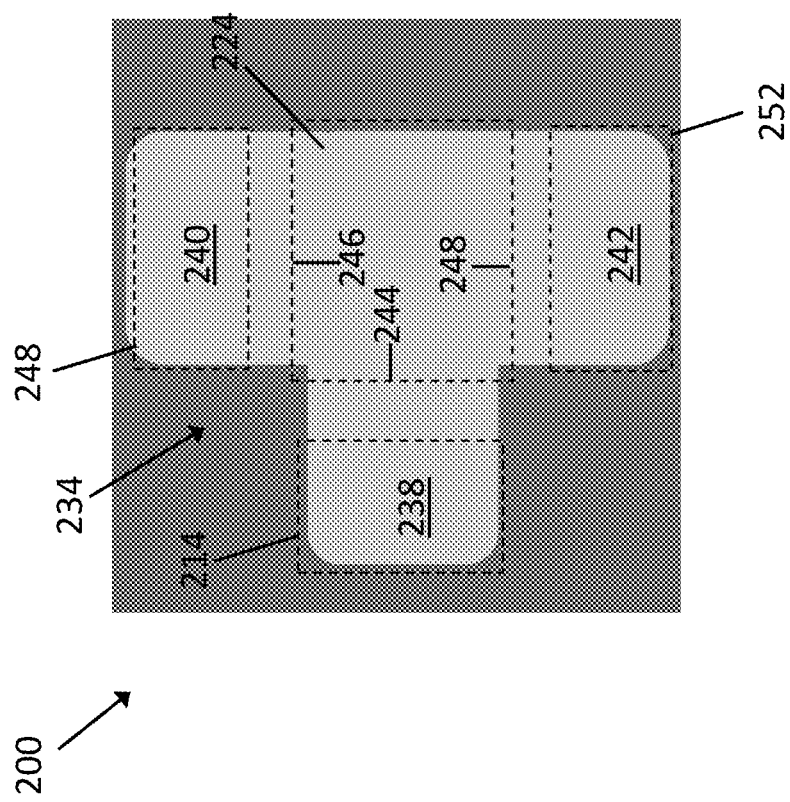
FIG. 5 illustrates a plan view of the packaged half-bridge circuit of FIG. 4, according to an embodiment.

Referring to FIGS. 4 and 5, a packaged device 200 is depicted, according to another embodiment. In this embodiment, the conductive connector 234 is a metal clip with a multi-directional configuration. As shown in FIG. 5, the conductive connector 234 includes a first wing 238, a second wing 240, and a third wing 242. Each of these wings are arranged to carry current away from the first semiconductor chip 224 in different directions. The conductive connector 234 is mounted such that the first wing 238 extends across a first edge side 244 of the first semiconductor chip 224 and reaches the second bond pad 214, the second wing 240 extends across a second edge side 246 of the first semiconductor chip 224 and reaches a sixth bond pad 248, and the third second wing 240 extends across a third edge side 250 of the first semiconductor chip 224 and reaches a seventh bond pad 252. FIG. 5 shows an outline of the semiconductor chip 224 and outlines of the second, sixth and seventh bond pads 214, 248, 252. The sixth and seventh bond pads 248, 252 are each formed in the first layer 206 of metallization and are electrically connected to the third bond pad 216 (i.e., the voltage source terminal) in a similar manner as the second bond pad 214. The multi-directional clip design of FIGS. 4 and 5 advantageously reduces the resistance associated with voltage source connection the high-side switch 102 of the half bridge circuit 100.

Figure 6:
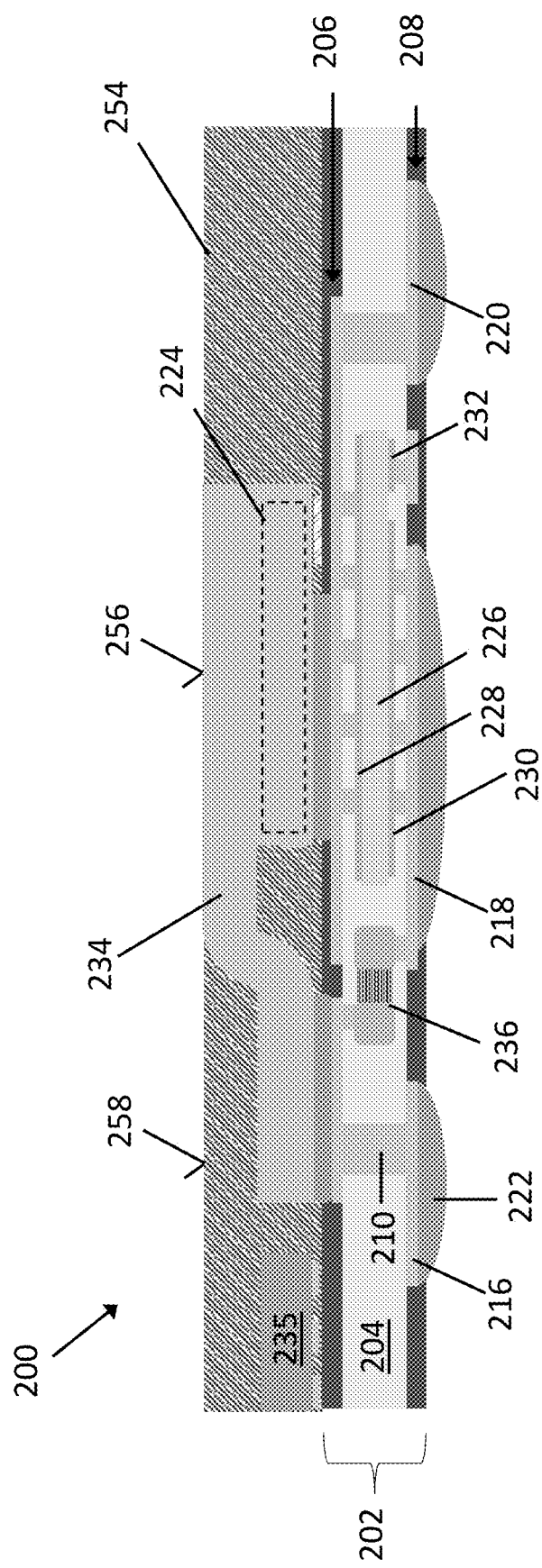
FIG. 6 illustrates a cross-sectional view of a packaged half-bridge circuit, according to an embodiment.

Referring to FIG. 6, a packaged device 200 is depicted, according to another embodiment. In this embodiment, the packaged device 200 additionally includes an electrically insulating encapsulant body 254 formed on the upper surface of the carrier 202. Generally speaking, the encapsulant body 254 can include any of a variety of mold compounds such as epoxy resins, thermosetting plastics, etc. The encapsulant body 254 can be formed by transfer molding techniques, e.g., injection molding, compression molding, etc.

The encapsulant body 254 encapsulates the first semiconductor chip 224. That is, the encapsulant body 254 surrounds and protects the first semiconductor chip 224 from the exterior environment. An upper surface 256 of the conductive connector 234 is exposed from an upper surface 258 of the encapsulant body 254. One benefit of this configuration is enhanced heat dissipation. In this case, the conductive connector 234 (a metal clip in this embodiment) draws heat away from the first semiconductor chip 224 and towards a surface that is exposed to the exterior environment. An external heat sink structure (not shown) may be mounted on top of the packaged device 200 for improved thermal dissipation.

Figure 7:
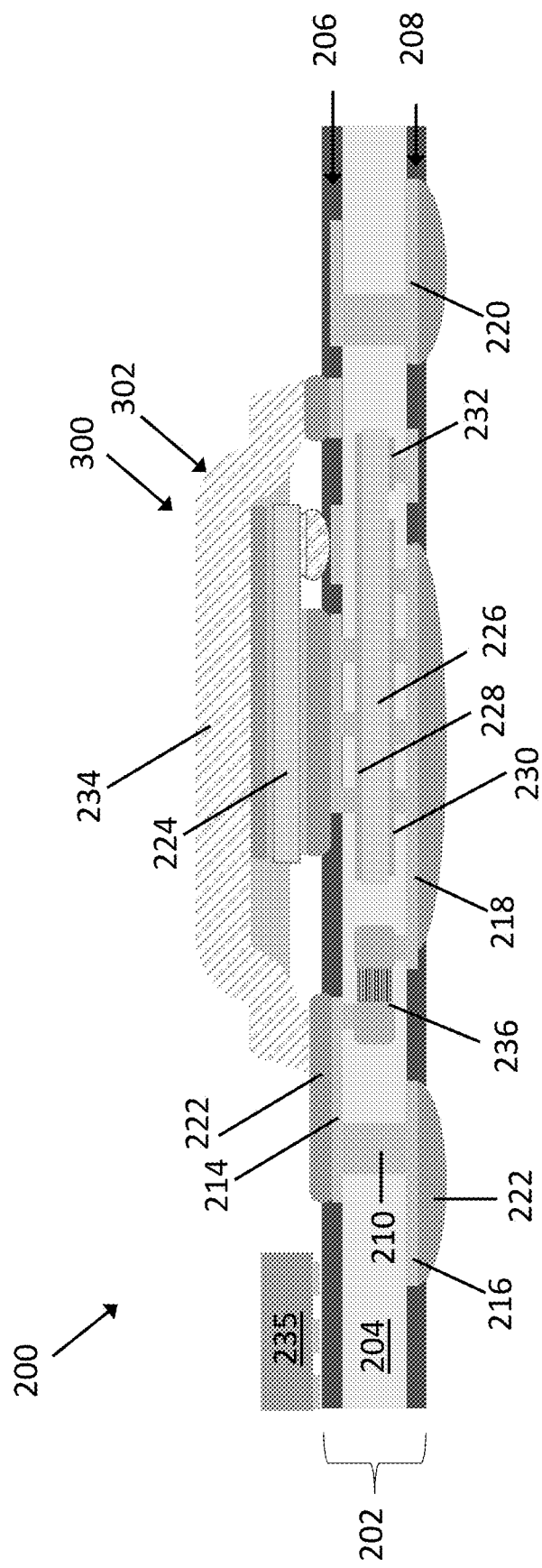
FIG. 7 illustrates a cross-sectional view of a packaged half-bridge circuit, according to an embodiment.

Referring to FIG. 7, a packaged device 200 is depicted, according to another embodiment. In this embodiment, the first semiconductor chip 224 and the conductive connector 234 are integral components of a discrete semiconductor device 300. Whereas in the previous embodiments the first semiconductor chip 224 and the conductive connector 234 are provided separately and mounted to the carrier 202 at different times, in this embodiment, these two elements are initially provided together as the discrete semiconductor device 300, and this discrete semiconductor device 300 is then mounted to the carrier 202. The discrete semiconductor device 300 is provided starting with an electrically conductive lead frame 302. The lead frame 302 can be provided from a metal sheet and structured by known techniques, e.g., etching, stamping, etc. The first semiconductor chip 224 is mounted on and electrically connected to the lead frame 302, e.g., using a conductive adhesive such as solder or sinter. The resultant device (i.e., the discrete packaged device 300) is then placed on and mounted to the carrier 202.

In this embodiment, the lead frame 302 of the discrete semiconductor device 300 provides the conductive connector 234. The discrete packaged device 300 is mounted on the carrier 202 such that the first semiconductor chip 224 is disposed between the lead frame 302 and the carrier 202. The second terminal 230 and the control terminal 232 of the first semiconductor chip 224 face the upper surface of the carrier 202 and may be electrically connected to the carrier 202 in a similar manner as previously described. The lead frame 302 extends pads the first semiconductor chip 224 and electrically contacts the second bond pad 214 in a similar manner as previously described. As shown, the carrier 202 may additionally include an eighth bond pad 260 in the first layer 206 of metallization, which provides a second connection point to the voltage source terminal.

Figure 8:
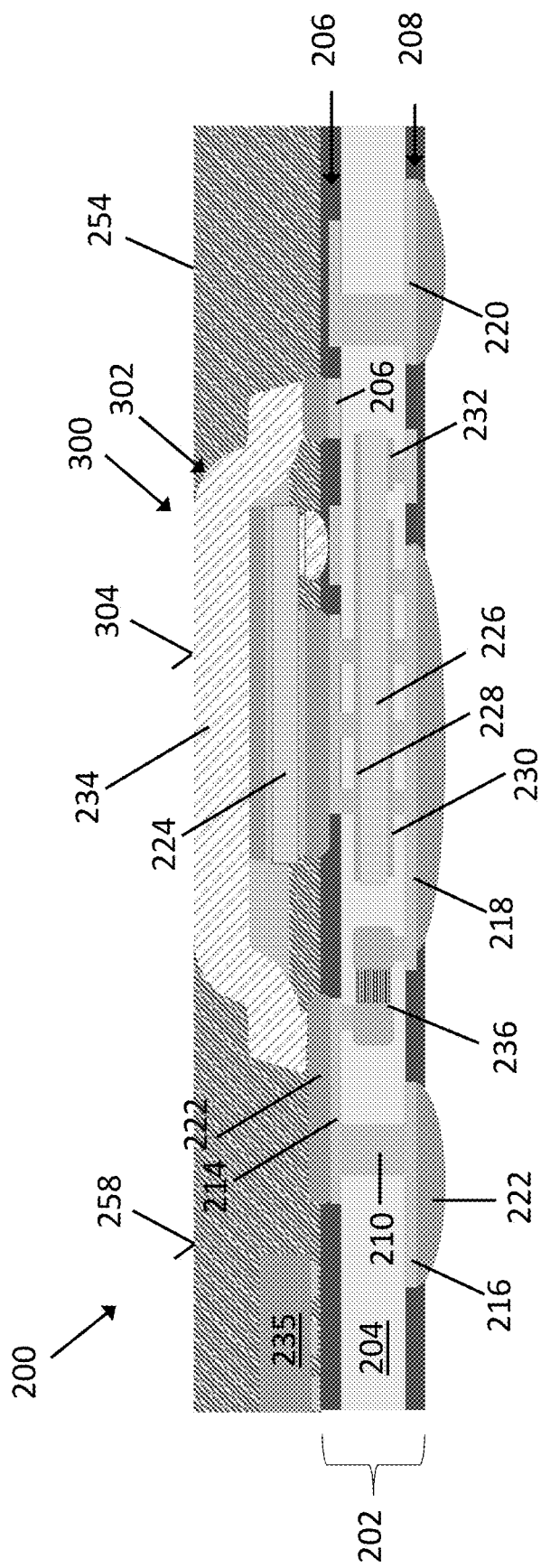
FIG. 8 illustrates a cross-sectional view of a packaged half-bridge circuit, according to an embodiment.

Referring to FIG. 8, a packaged device 200 is depicted, according to another embodiment. This packaged device 200 is identical to the device of FIG. 2, except that the packaged device 200 additionally incudes an encapsulant body 254. The encapsulant body 254 can be substantially similar or identical to the encapsulant body 254 in the embodiment of FIG. 6. An upper surface 304 of the lead frame 302 is exposed from an upper surface 258 of the encapsulant body 254. Hence, the lead frame 302 provides a hear dissipating structure in a similar manner as the metal clip discussed with reference to FIG. 6.

Figure 9:
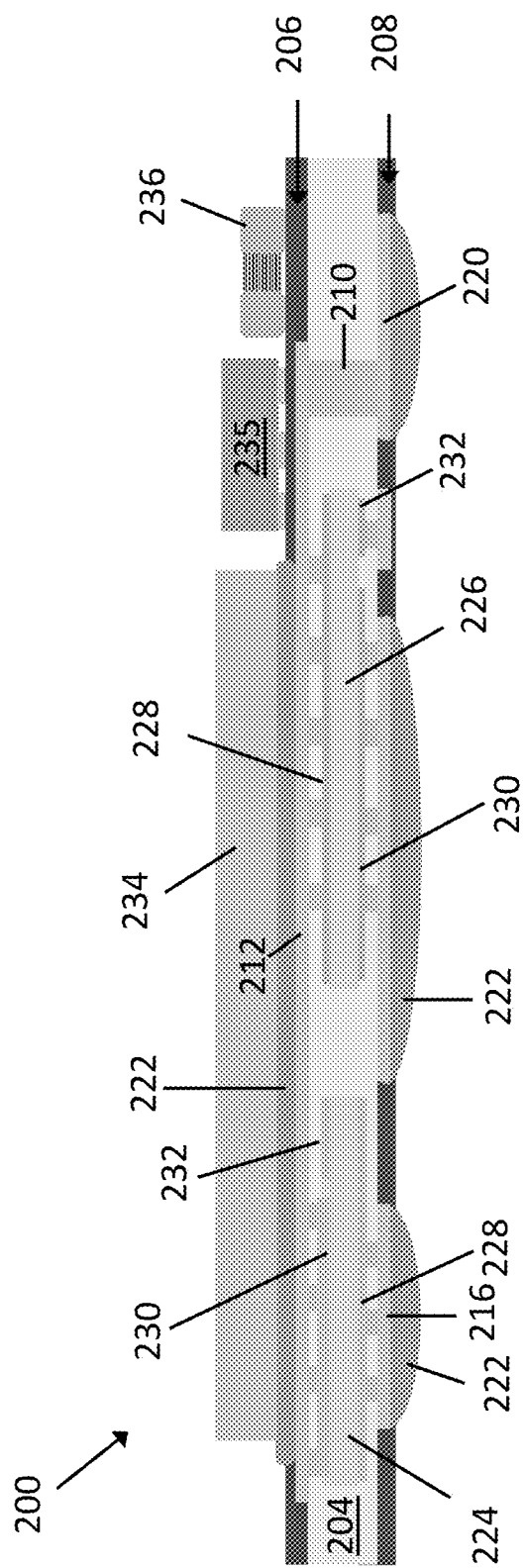
FIG. 9 illustrates a cross-sectional view of a packaged half-bridge circuit, according to an embodiment.

Referring to FIG. 9, a packaged device 200 is depicted, according to another embodiment. Different to the previously described embodiments, the first semiconductor chip 224 is embedded within the dielectric core 204 of the carrier 202. Hence, both of the first and second semiconductor chips 224, 226 are embedded within the dielectric core 204 in this embodiment. The first semiconductor chip 224 is arranged such that the first terminal 228 of the first semiconductor chip 224 is disposed on a rear surface of the first semiconductor chip 224 which faces the lower surface of the carrier 202. The first terminal 228 of the first semiconductor chip 224 is electrically connected to the third bond pad 216 (i.e., the voltage source terminal) by a via structure 210. Moreover, the first semiconductor chip 224 is arranged such that the second terminal 230 and the control terminal 232 of the first semiconductor chip 224 are disposed on a main surface of the first semiconductor chip 224 which faces the upper surface of the carrier. The second terminal 230 of the first semiconductor chip 224 and the first terminal 228 of the second semiconductor chip 226 are each connected to the first bond pad 212 by via structures 210.

In the embodiment of FIG. 9, the conductive connector 234 provides an alternate current path for the output terminal of the half-bridge circuit 100 in addition to the first bond pad 212. The conductive connector 234, which is implemented as a metal clip in this embodiment, is mounted directly on the first bond pad 212. In this case, a large region of conductive adhesive 222, e.g., solder, sinter, etc., may be provided on the first bond pad 212, and the large surface area portion of the conductive connector 234 can be attached by this conductive adhesive 212. As a result, the electrical resistance between the second terminal 230 of the first semiconductor chip 224 and the fifth bond pad 220, i.e., the output terminal of the half-bridge circuit 100, is lowered.

Figure 10:
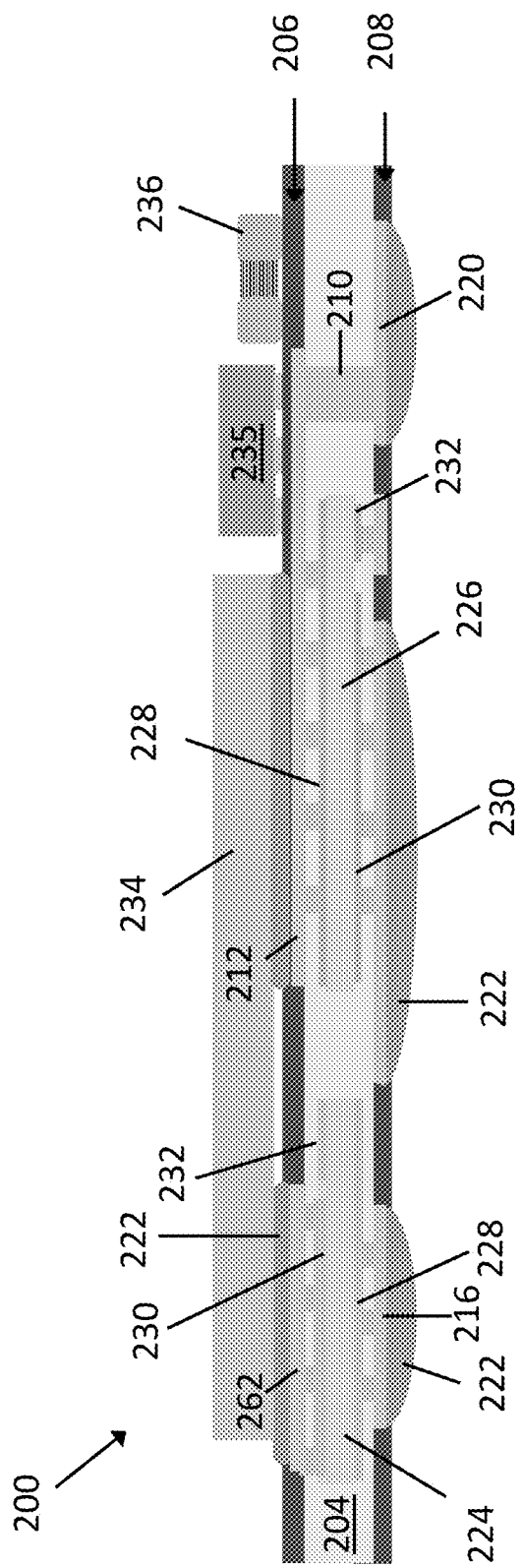
FIG. 10 illustrates a cross-sectional view of a packaged half-bridge circuit, according to an embodiment.

Referring to FIG. 10, a packaged device 200 is depicted, according to another embodiment. The embodiment of FIG. 10 is identical to the embodiment of FIG. 9, except that the conductive connector 234 is not mounted on a continuous bond pad structure. Instead, the carrier 202 includes a ninth bond pad 262 that is directly above the first semiconductor chip 224. The ninth bond pad 262 is formed in the first layer 206 of metallization. A gap is provided between the ninth bond pad 262 and the first bond pad 212 such that these two bond pads are electrically isolated in the absence of an external electrical connection. Separate regions of conductive adhesive 222 are provided on the first and ninth bond pads 212, 262, and the conductive connector 234 electrically connected to both first and ninth bond pads 212, 262 via the conductive adhesive 222. As a result, the conductive connector 234 is arranged such that current must flow through the conductive connector 234 when flowing between the second terminal 230 of the first semiconductor chip and the third bond pad 220 (i.e., the output terminal of the half-bridge circuit 100). Accordingly, the output connection of the high-side switch 102 has a low-impedance connection path.

The term "electrically connected," "directly electrically connected" and the like as used herein describes a permanent low-impedance connection between electrically connected elements, for example a direct contact between the relevant elements or a low-impedance connection via a metal and/or a highly doped semiconductor.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

Each embodiment is provided by way of explanation and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A half-bridge circuit, comprising:
a carrier comprising a dielectric core and a first layer of metallization formed on an upper surface of the carrier;
first and second semiconductor chips, each comprising a first terminal, a second terminal, and a control terminal; and
a conductive connector mounted on the upper surface of the carrier and electrically connected to the first layer of metallization;
wherein the first semiconductor chip is configured as a high-side switch of the half-bridge circuit,
wherein the second semiconductor chip is configured as a low-side switch of the half-bridge circuit,
wherein at least one of the first and second semiconductor chips is embedded within the dielectric core of the carrier, and
wherein the conductive connector is electrically connected to one of the first and second terminals from one or both of the first and second semiconductor chips,
wherein the second semiconductor chip is embedded within the dielectric core of the carrier, wherein the first terminal of the second semiconductor chip is disposed on a rear surface of the second semiconductor chip which faces the upper surface of the carrier, and wherein first terminal of the second semiconductor chip is electrically connected to a first bond pad that is formed in the first layer of metallization, and wherein the first terminal of the first semiconductor chip is disposed on a rear surface of the first semiconductor chip which faces away from the upper surface of the carrier, wherein the conductive connector is electrically connected to the first terminal of the first semiconductor chip and to a second bond pad that is formed in the first layer of metallization, and wherein the second bond pad is configured as a power terminal of the half-bridge circuit.

2. The half-bridge circuit of claim 1, wherein the half bridge circuit further comprises a driver chip that is electrically connected to the control terminals of the first and second semiconductor chips, and wherein the driver chip is disposed on or within the carrier.

3. The half-bridge circuit of claim 2, wherein the driver chip is mounted on the upper surface of the carrier.

4. The half-bridge circuit of claim 2, wherein the driver chip is embedded within the dielectric core of the carrier.

5. The half-bridge circuit of claim 1, wherein the half bridge circuit further comprises a passive electrical component that is electrically connected to one or both of the high-side and the low-side switches, and wherein the passive electrical component is disposed on or within the carrier.

6. The half-bridge circuit of claim 1, wherein the first terminal of the first semiconductor chip is disposed on a rear surface of the first semiconductor chip which faces away from the upper surface of the carrier, wherein the conductive connector is electrically connected to the first terminal of the first semiconductor chip and to a second bond pad that is formed in the first layer of metallization, and wherein the second bond pad is configured as a power terminal of the half-bridge circuit.

7. The half-bridge circuit of claim 6, wherein the conductive connector is a metal clip that is affixed to the first semiconductor chip and to the second bond pad by a conductive adhesive material.

8. The half-bridge circuit of claim 7, wherein the carrier further comprises third and fourth bonds that are each formed in the first layer of metallization, wherein the third and fourth bond pads are each configured as a power terminal of the half-bridge circuit, wherein the metal clip comprises a first wing that extends across a first edge side of the first semiconductor chip and reaches the second bond pad, a second wing that extends across a second edge side of the first semiconductor chip and reaches the third bond pad, and a third wing that extends across a third edge side of the first semiconductor chip and reaches the fourth bond pad.

9. The half-bridge circuit of claim 6, further comprising an electrically insulating encapsulant body that is formed on the upper surface of the carrier, wherein the encapsulant body encapsulates the first semiconductor chip, and wherein an upper surface of the metal clip is exposed from an upper surface of the encapsulant body.

10. The half-bridge circuit of claim 9, wherein the first semiconductor chip and the conductive connector are integral components of a discrete packaged semiconductor device that is mounted on the upper surface of the carrier, wherein the conductive connector is a lead frame of the discrete packaged semiconductor device, wherein the discrete packaged semiconductor device is arranged with the first semiconductor chip disposed between the lead frame and the carrier, and wherein the lead frame extends to and electrically contacts the second bond pad.

11. The half-bridge circuit of claim 9, further comprising an electrically insulating encapsulant body that is formed on the upper surface of the carrier, wherein the encapsulant body encapsulates the discrete packaged semiconductor device, and wherein an upper surface of the lead frame is exposed from an upper surface of the encapsulant body.

12. The half-bridge circuit of claim 1, wherein the first semiconductor chip is embedded within the dielectric core of the carrier, wherein the second terminal of the first semiconductor chip is disposed on a main surface of the second semiconductor chip which faces the upper surface of the carrier, and wherein the conductive connector electrically connects the second terminal of the first semiconductor chip to the first terminal of the second semiconductor chip.

13. The half-bridge circuit of claim 12, wherein the conductive connector is a metal clip that is affixed to the first semiconductor chip and to the second bond pad by a conductive adhesive material, wherein the metal clip is part of a conductive connection that current must flow through when flowing between the second terminal of the first semiconductor chip device and the first terminal of the second semiconductor chip.

14. A method of producing a half-bridge circuit, the method comprising:
providing a carrier comprising a dielectric core and a first layer of metallization formed on an upper surface of the carrier;
providing first and second semiconductor chips, each comprising a first terminal, a second terminal, and a control terminal;
mounting a conductive connector on the upper surface of the carrier and electrically connecting the connective connector to the first layer of metallization;
embedding the second semiconductor chip within the dielectric core of the carrier such that a rear surface of the second semiconductor chip that comprises the first terminal of the second semiconductor chip faces the upper surface of the carrier;
mounting the first semiconductor chip on the upper surface of the carrier such that a rear surface of the first semiconductor chip that comprises the first terminal faces away from the upper surface of the carrier; and
electrically connecting the first terminal of the first semiconductor chip to a second bond pad that is formed in the first layer of metallization with the conductive connector,
wherein the first semiconductor chip is configured as a high-side switch of the half-bridge circuit,
wherein the second semiconductor chip is configured as a low-side switch of the half-bridge circuit,
wherein at least one of the first and second semiconductor chips is embedded within the dielectric core of the carrier, and
wherein the conductive connector is electrically connected to one of the first and second terminals from one or both of the first and second semiconductor chips.

15. The method of claim 14, wherein electrically connecting the first terminal of the first semiconductor chip to the first bond pad comprises attaching a metal clip to the first terminal of the first semiconductor chip and to the second bond pad.

16. The method of claim 14, further comprising providing a discrete packaged semiconductor device comprising the first semiconductor chip mounted on an electrically conductive lead frame, wherein the mounting of the first semiconductor chip and the electrically connecting of the first terminal comprises mounting the discrete packaged semiconductor device on the upper surface of the carrier with the first semiconductor chip disposed between the lead frame and the carrier and with the lead frame extending to and electrically contacting the second bond pad.

17. A half-bridge circuit, comprising:
  a carrier comprising a dielectric core and a first layer of metallization formed on an upper surface of the carrier;
  first and second semiconductor chips, each comprising a first terminal, a second terminal, and a control terminal; and
  a conductive connector mounted on the upper surface of the carrier and electrically connected to the first layer of metallization;
  wherein the first semiconductor chip is configured as a high-side switch of the half-bridge circuit,
  wherein the second semiconductor chip is configured as a low-side switch of the half-bridge circuit,
  wherein at least one of the first and second semiconductor chips is embedded within the dielectric core of the carrier, and
  wherein the conductive connector is electrically connected to one of the first and second terminals from one or both of the first and second discrete semiconductor switching devices,
  wherein the half bridge circuit further comprises a driver chip that is electrically connected to the control terminals of the first and second semiconductor chips, and,
  wherein the driver chip is mounted on the upper surface of the carrier.

18. A half-bridge circuit, comprising:
  a carrier comprising a dielectric core and a first layer of metallization formed on an upper surface of the carrier;
  first and second semiconductor chips, each comprising a first terminal, a second terminal, and a control terminal; and
  a conductive connector mounted on the upper surface of the carrier and electrically connected to the first layer of metallization;
  wherein the first semiconductor chip is configured as a high-side switch of the half-bridge circuit,
  wherein the second semiconductor chip is configured as a low-side switch of the half-bridge circuit,
  wherein at least one of the first and second semiconductor chips is embedded within the dielectric core of the carrier,
  wherein the conductive connector is electrically connected to one of the first and second terminals from one or both of the first and second semiconductor chips, and
  wherein the conductive connector is a metal clip that is affixed to the first semiconductor chip and to the second bond pad by a conductive adhesive material.

* * * * *

UNITED STATES PATENT AND TRADEMARK OFFICE
CERTIFICATE OF CORRECTION

| | |
|---|---|
| PATENT NO. | : 11,469,164 B2 |
| APPLICATION NO. | : 16/744967 |
| DATED | : October 11, 2022 |
| INVENTOR(S) | : R. Fehler et al. |

It is certified that error appears in the above-identified patent and that said Letters Patent is hereby corrected as shown below:

In the Claims

Column 16, Line 3 (Claim 17), please change "and," to -- and --.

Signed and Sealed this
Sixth Day of December, 2022

*Katherine Kelly Vidal*

Katherine Kelly Vidal
*Director of the United States Patent and Trademark Office*